United States Patent
Rajamani et al.

(10) Patent No.: US 12,242,338 B2
(45) Date of Patent: Mar. 4, 2025

(54) MEMORY SPARING TO IMPROVE CHIP RELIABILITY

(71) Applicant: Google LLC, Mountain View, CA (US)

(72) Inventors: Gurushankar Rajamani, Sunnyvale, CA (US); Horia Alexandru Toma, Sunnyvale, CA (US); Le Wang, Sunnyvale, CA (US); Spoorthy Nanjaiah, San Jose, CA (US); Albert Forte Magyar, Emeryville, CA (US); Xiaoming Wang, Sunnyvale, CA (US)

(73) Assignee: Google LLC, Mountain View, CA (US)

(*) Notice: Subject to any disclaimer, the term of this patent is extended or adjusted under 35 U.S.C. 154(b) by 46 days.

(21) Appl. No.: 18/324,431

(22) Filed: May 26, 2023

(65) Prior Publication Data

US 2024/0394141 A1  Nov. 28, 2024

(51) Int. Cl.
G06F 11/00 (2006.01)
G06F 11/10 (2006.01)
G06F 12/02 (2006.01)

(52) U.S. Cl.
CPC ...... *G06F 11/1016* (2013.01); *G06F 12/0292* (2013.01)

(58) Field of Classification Search
CPC ............... G06F 11/1016; G06F 11/073; G06F 11/2017; G06F 11/1666; G06F 11/3037; G06F 12/0292

See application file for complete search history.

(56) References Cited

U.S. PATENT DOCUMENTS

| | | | |
|---|---|---|---|
| 7,827,372 B2 * | 11/2010 | Bink | G11C 29/76 711/3 |
| 8,819,391 B1 * | 8/2014 | Lock | G06F 12/1027 711/206 |
| 2010/0177579 A1 | 7/2010 | Katayama et al. | |
| 2016/0041878 A1 | 2/2016 | Davis et al. | |
| 2019/0347151 A1 * | 11/2019 | Eno | G11C 29/76 |
| 2021/0303425 A1 * | 9/2021 | Pozidis | H03M 13/154 |
| 2022/0012195 A1 * | 1/2022 | Galbi | G06F 12/0292 |

OTHER PUBLICATIONS

International Search Report and Written Opinion for International Application o. PCT/US2024/017842 dated Jun. 6, 2024. 13 pages.

* cited by examiner

Primary Examiner — Joseph D Manoskey
(74) Attorney, Agent, or Firm — Lerner David LLP (57) ABSTRACT

The mapping of system memory addresses to physical memory addresses is modeled as a two dimensional mapping array. Each element of the mapping array is assigned a system memory address and a physical memory address to which the system memory address is mapped. The mapping array is arranged to facilitate designation of a portion of the physical memory addresses as spareable physical memory addresses that are employed when there is a memory failure.

16 Claims, 8 Drawing Sheets

MEMORY SPARING TO IMPROVE CHIP RELIABILITY

BACKGROUND

When using a high value integrated circuit in a computing application it is common to embed the circuit in a package that includes a memory accessible by the circuit. For example, an application-specific integrated circuit (ASIC) may be embedded in a package that includes a high bandwidth memory (HBM) accessible by the ASIC. However, when a high value integrated circuit is embedded in a package with a memory, the memory is not typically serviceable apart from the circuit, and therefore when the memory fails it is typical to discard the whole package.

BRIEF SUMMARY

It has been recognized that there is a desire to manage memory failures without having to discard a package in which the memory is included.

In view of the desire for improved management of memory failures, the presently disclosed technology is provided. The technology is applicable, for example, to systems in which a high value integrated circuit is packaged with a HBM device. In such systems, if a memory failure is localized to a channel, HBM sparing in accordance with the technology provides a way for the package (e.g., a chip) to disable the channel and distribute all memory accesses to other channels evenly. Data from HBM deployment indicates that failures are frequently localized to a pseudo-channel. A HBM3 device has 16 channels and 2 pseudo-channels per channel. If a package has 4 HBM3 devices, it will have 64 channels and 128 pseudo-channels. Accordingly, a channel sparing strategy in accordance with the presently disclosed technology will allow a 4 HBM3 device to operate with memory capacity and bandwidth reduced by $1/64^{th}$, while a pseudo-channel sparing strategy in accordance with the technology will allow the 4 HBM3 device to operate with memory capacity and bandwidth reduced by $1/128$.

In one aspect, the presently disclosed technology provides a method for mapping system memory addresses to physical memory addresses, including arranging a plurality of system memory addresses into a mapping array having a number of rows equal to a number of physical memory addresses in a minimum spareable entity unit, and a number of columns equal to a number of minimum spareable entity units; and assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units, wherein when one of the minimum spareable entity units becomes an unavailable minimum spareable entity unit, designating a column of the mapping array as a remapping column for the unavailable minimum spareable entity unit, and for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column.

In another aspect, the presently disclosed technology provides a processing system including a processor; and a memory, wherein system memory addresses are mapped to physical memory addresses of the memory by arranging a plurality of system memory addresses into a mapping array having a number of rows equal to a number of physical memory addresses in a minimum spareable entity unit, and a number of columns equal to a number of minimum spareable entity units; and assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units, wherein when one of the minimum spareable entity units becomes an unavailable minimum spareable entity unit, designating a column of the mapping array as a remapping column for the unavailable minimum spareable entity unit, and for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column.

BRIEF DESCRIPTION OF THE DRAWINGS

The accompanying drawings are not intended to be drawn to scale. Also, for purposes of clarity not every component may be labeled in every drawing. In the drawings.

DETAILED DESCRIPTION

Examples of systems and methods are described herein. It should be understood that the words "example," "exemplary" and "illustrative" are used herein to mean "serving as an example, instance, or illustration." Any embodiment or feature described herein as being an "example," "exemplary" or "illustration" is not necessarily to be construed as preferred or advantageous over other embodiments or features. In the following description, reference is made to the accompanying figures, which form a part thereof. In the figures, similar symbols typically identify similar components, unless context dictates otherwise. Other embodiments may be utilized, and other changes may be made, without departing from the spirit or scope of the subject matter presented herein.

The example embodiments described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

Figure 1:
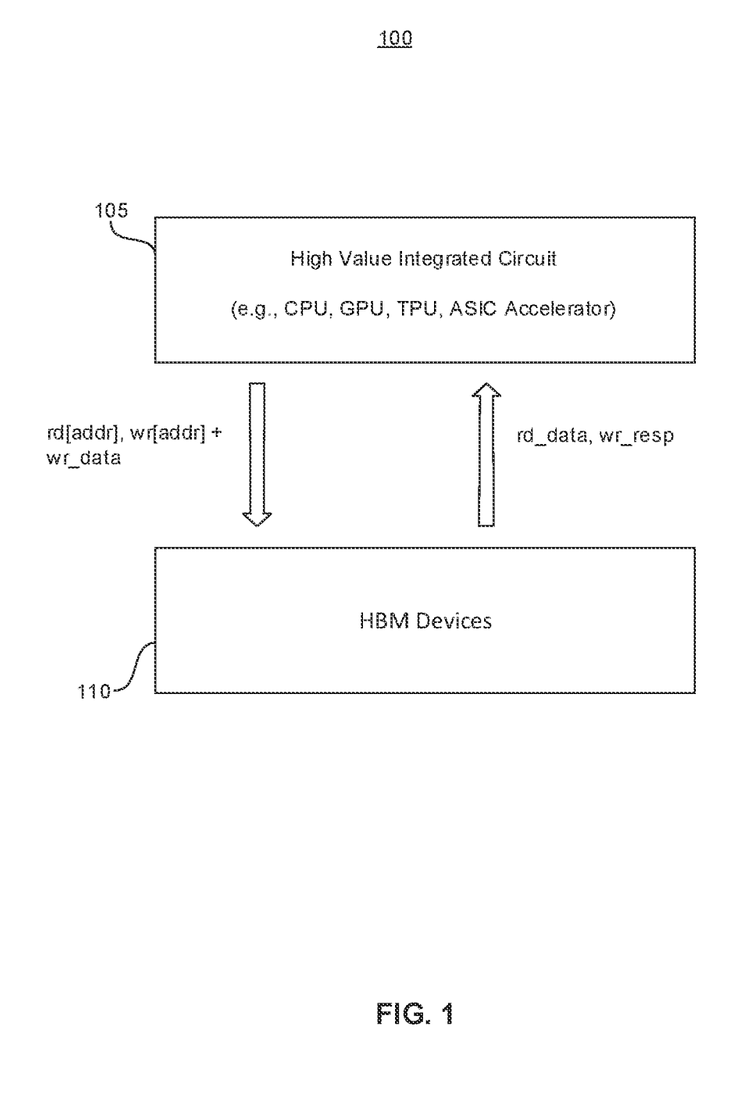
FIG. 1 is a block diagram of an example computing system in which the presently disclosed technology may be implemented.

FIG. 1 is a block diagram of an example computing system 100 in which the presently disclosed technology may be implemented. The computing system 100 includes a high value integrated circuit 105 coupled to one more HBM devices 110. As shown in the figure, the high value integrated circuit 105 may be, for example, a central processing unit (CPU), a graphics processing unit (GPU), a tensor processing unit (TPU), or an ASIC accelerator. A high value integrated circuit can refer to an integrated circuit for which it is preferred or predetermined that a package including the integrated circuit not be replaced in the event of a failure, but rather that failures are managed according to aspects of this disclosure. The decision to manage the failures (e.g., memory failures) instead of replacing the package may be based on, for example, the ability to employ spares in the package instead of replacing the package, a cost associated with replacing the integrated circuit/package, including device downtime, and/or the difficulty of replacing the integrated circuit/package, etc.

The high value integrated circuit 105 may read data from the HBM devices 110 or write data to the HBM devices 110 as needed during the course of performing a computing function. The HBM devices 110 may include a memory and a memory management unit, with the memory management unit operable to translate system memory addresses (e.g., virtual memory addresses) provided by the high value integrated circuit 105 to physical memory addresses designating locations within the memory. In some embodiments, software running on the high value integrated circuit 105 views the address space of the memory of the HBM devices 110 as a linear address space, and sends read and write commands to the HBM devices using system memory addresses which are linearly organized, and which are translated by the memory management unit to physical memory addresses of the memory.

To map the system memory addresses to the physical memory addresses the memory of the HBM devices 110 can be modeled as a two dimensional array. Each element of the array is assigned a system memory address and a physical memory address, thereby mapping the system memory address of the element to the physical memory address of the element. Accordingly, the array is referred to as a mapping array. Moreover, the array is arranged to facilitate use of a portion of the physical memory addresses as spare physical memory addresses in the event there is a memory failure. That is, when a portion of the memory fails, a non-failed portion of the memory is designated as spareable and any system memory addresses mapped to the failed portion are remapped to the spareable portion. Since the spareable portion is used for remapping, it is not available for original mapping, and thus when a non-failed portion is used as spareable there is a reduction in the total number of system memory addresses that can be mapped to physical memory addresses. The reduction in the total number of system memory addresses that can be mapped to physical memory addresses reflects the reduction in available physical memory caused by the memory failure. In any event, a minimum portion of memory that can be designated as spareable in the event of a memory failure is referred to as a minimum spareable entity.

Prior to describing the mapping array in more detail, it is noted that the columns of the mapping array are the same size as the size of the minimum spareable entity. For example, if a channel is the minimum spareable entity then the column size is the same as the channel size. Other minimum spareable entities that may be used are a pseudo-channel, a memory bank or a memory page. The rest of this description will assume that the minimum spareable entity is a channel. Nevertheless, upon review of this description one can readily appreciate how the disclosed technology may be implemented with other types of minimum spareable entities.

It is further noted, that in embodiments of the presently disclosed technology generation of mapping arrays, mapping system memory addresses to physical memory addresses, and remapping system memory addresses to physical memory addresses may be performed by the high value integrated circuit 105. For example, when the high value integrated circuit 105 is a TPU, the functions of array generation, mapping, and remapping may be implemented in the TPU's interconnect logic.

Figure 2:
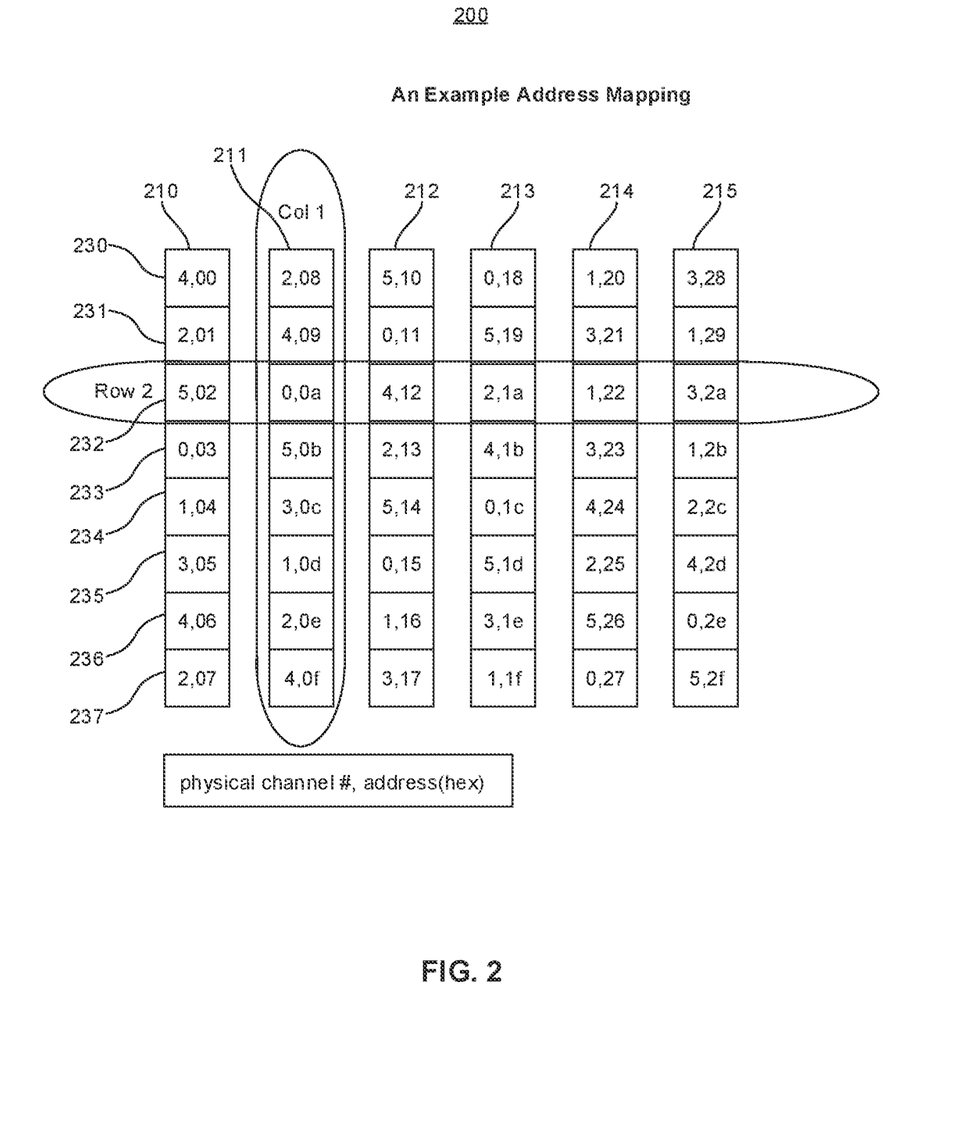
FIG. 2 is a representation of an illustrative mapping array for mapping system memory addresses to physical memory addresses according to an embodiment.

Turning now to FIG. 2, the figure is a representation of an illustrative mapping array 200 for mapping system memory addresses to physical memory addresses according to an embodiment. In the illustration of FIG. 2, the mapping array 200 is for a system having six channels of memory with each channel having a size of eight. The mapping array 200 is used to map 48 system memory addresses, numbered 00 to 2f in hexadecimal notation, to the six channels, numbered 0 to 5. Since the minimum spareable entity unit is a channel and there are six channels being mapped, the mapping array 200 has six columns 210, 211, 212, 213, 214, and 215; and since the channel size is eight, the mapping array 200 has eight rows 230, 231, 232, 233, 234, 235, 236, and 237.

For each entry in the mapping array 200, the numbers for the element indicate the channel of assignment followed by the system memory address. Thus, row 230, column 210 of the mapping array 200 shows that system memory address 00 is mapped to channel 4. Further, the row number corresponding to an element in the mapping array 200 corresponds to an offset within the channel for that element. For example, the physical memory address corresponding to row 230, column 210 is channel 4/offset 0, and thus system memory address 00 is mapped to physical memory address channel 4/offset 0. Whereas the physical memory address corresponding to row 236, column 210 is channel 4/offset 6, and therefore system memory address 06 is mapped to physical memory address channel 4/offset 6. The offset values corresponding to rows 210-237 may be, for example, any one of pseudo-channel numbers, memory bank numbers, memory page offsets, or column offsets within a memory page. For example, the element designated by row 230, column 210 may correspond to a first memory bank of storage space accessible through channel 4, while the element designated by row 231, column 210 may correspond to a second memory bank of storage space accessible through channel 2.

Regarding offsets, it should be noted that there are many alternative schemes for relating offset values to mapping array rows. For instance, the relationship between offset values to exact locations in a channel can be more sophisticated than a linear relationship. Moreover, the schemes by which offset values are related to rows may vary among channels. That is, for each channel, the relationship between offset values and row may be implemented in any desired manner as long as a 1:1 relationship is maintained for offset value: physical location. Nevertheless, it is envisioned that in many implementations the offset values for channels will be consistent within a row, e.g., in FIG. 2 row 230, the offset value is 0 for each channel, such that for the element designated by row 230, column 210 may correspond to a first memory bank of storage space accessible through channel 4, while the element designated by row 230, column 211 may also correspond to a first memory bank, albeit a first memory bank of storage space accessible through channel 2.

In the FIG. 2 illustration, the memory is assumed to be fully functional. That is, FIG. 2 represents a mapping array without sparing. No portion of the memory has become unavailable (e.g., has failed), and therefore each of the 48 physical memory addresses represented by the mapping array 200 is mapped to a system memory address, allowing 48 system memory addresses to be mapped. Notably, for each of rows 230-237, none of channels 0-5 is assigned more than once. By not repeatedly assigning channels 0-5 in any row, mapping conflicts are avoided since it is not possible for more than one system memory address to be mapped to the same channel/offset. Also, by not repeatedly assigning channels 0-5 in any row, remapping conflicts are avoided because system memory addresses are remapped within the same row when there is a memory failure and it is not possible for a system memory address in a row to be remapped to the same channel. Now, in the event of a memory failure in which one channel is damaged, one of the columns 210-215 of the mapping array 200 is designated as a spareable column (or "remapping column"). In such an event, the physical memory addresses corresponding to the spareable column are not available for "original" mapping to system memory addresses because the physical memory addresses of the spareable column must be available for remapping to system memory addresses of other columns.

Regarding the spareable column, it should be noted that it is envisioned that in many implementations the designated spareable column will be either the first or last column of the mapping array so as to maintain an unbroken chain of mapped system memory addresses. For example, for mapping array 200 column 215 is designated as a spareable column so that the mapped system memory addresses are contiguous from 00 to 27.

Figure 3:
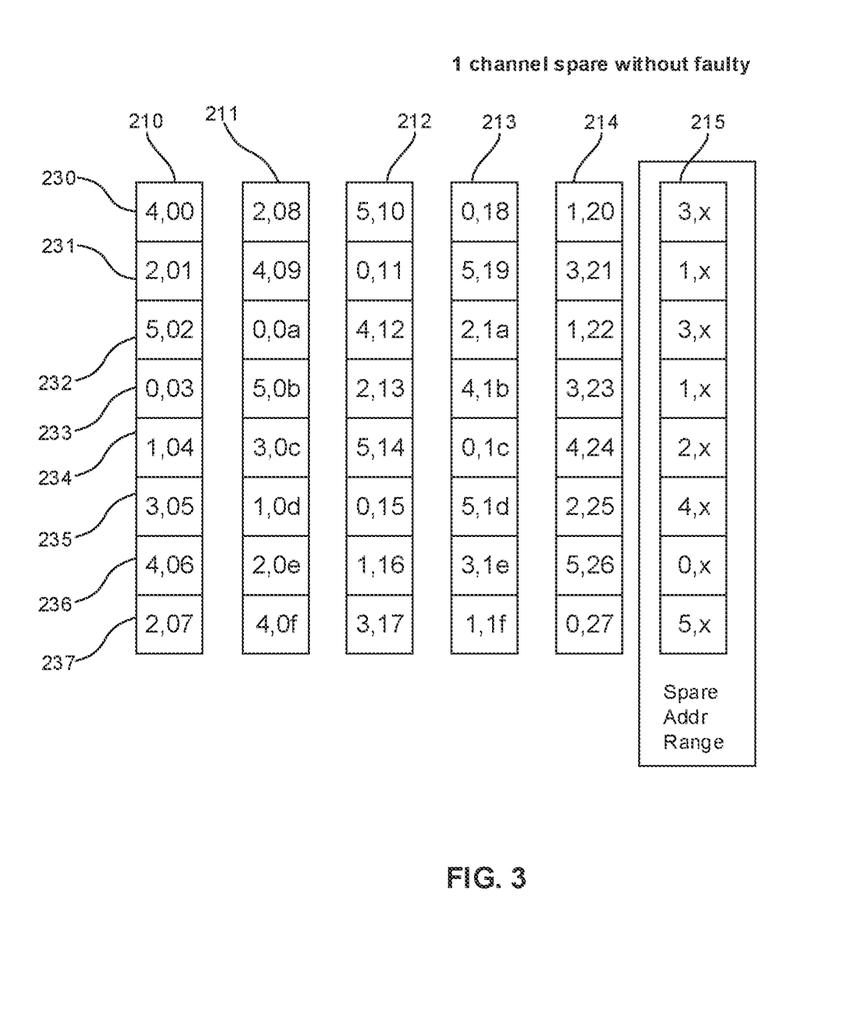
FIG. 3 is a representation of an illustrative mapping array having a column designated as a spare, for use as a remapping column.

Referring to FIG. 3, the figure shows a representation of an illustrative mapping array 300 which is based on the mapping array 200 of FIG. 2 but having column 215 designated as a spareable column. As can be seen from FIG. 3, the physical memory addresses of column 215 are not mapped to system memory addresses as the physical memory addresses of column 215 will be remapped to the system memory addresses originally mapped to a failed channel. FIG. 3 represents the mapping array 300 before remapping, that is, the figure represents a mapping array with sparing but before remapping.

Notably, the configuration of FIG. 3 is depicted primarily for descriptive purposes. It is envisioned that in practice a mapping array column will typically be designated as a spareable column only after occurrence of a memory failure. In which case, the physical memory addresses of a column to be designated as a spareable column (e.g., column 215) would be mapped to system memory addresses prior to a failure, and such prior mappings would be ignored or invalidated after the failure has occurred and the column has been designated as a spareable column.

Figure 4:
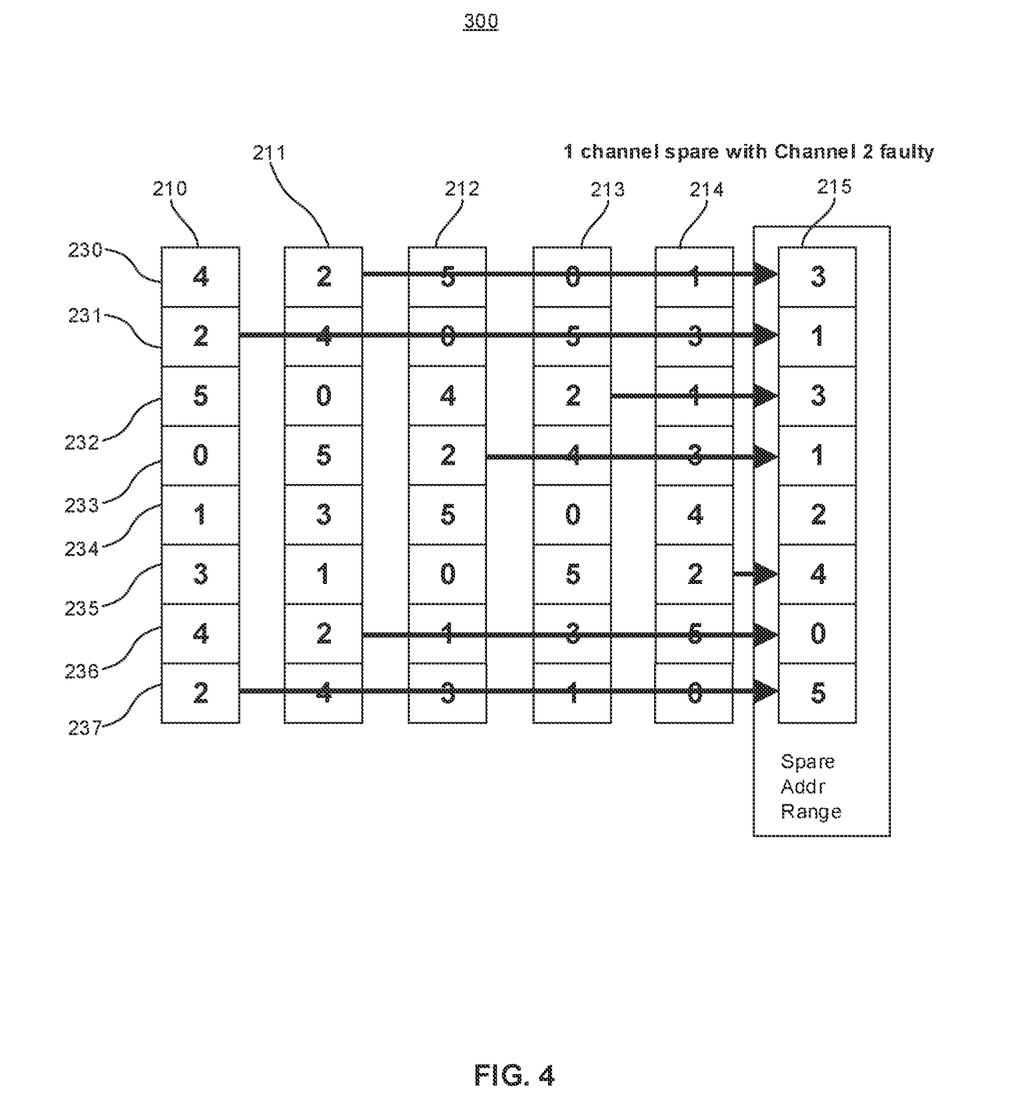
FIG. 4 is a representation of the illustrative mapping array of FIG. 3, with annotations showing an example of remapping in the event of a memory failure.

In any event, FIG. 4 shows the illustrative mapping array 300 of FIG. 3, with annotations showing an example of remapping in the event of a memory failure. In the illustration of FIG. 3, channel 2 (a minimum spareable entity) has become unavailable because all or part of channel 2 has failed. Accordingly, all of the non-spareable physical memory addresses that are mapped to channel 2 are remapped. Thus, as can be seen from the figure, the system memory address originally corresponding to row 230, column 211 is remapped from channel 2/offset 0 to channel 3/offset 0, and may be said to now correspond to row 230, column 215. Moreover, if system memory address 08 was originally mapped to channel 2/offset 0, as shown in FIG. 3, then system memory address 08 is remapped to channel 3/offset 0 following the failure of channel 2. Similarly, the system memory address originally corresponding to row 231, column 210 is remapped from channel 2/offset 1 to channel 1/offset 1; the system memory address originally corresponding to row 232, column 213 is remapped from channel 2/offset 2 to channel 3/offset 2; the system memory address originally corresponding to row 233, column 212 is remapped from channel 2/offset 3 to channel 1/offset 3; the system memory address originally corresponding to row 235, column 214 is remapped from channel 2/offset 5 to channel 4/offset 5; the system memory address originally corresponding to row 236, column 211 is remapped from channel 2/offset 6 to channel 0/offset 6; and the system memory address originally corresponding to row 237, column 210 is remapped from channel 2/offset 7 to channel 5/offset 7. Regarding row 234, since none of the non-spareable physical memory addresses for the row were originally mapped to channel 2, no remapping is necessary for the row.

Figure 5:
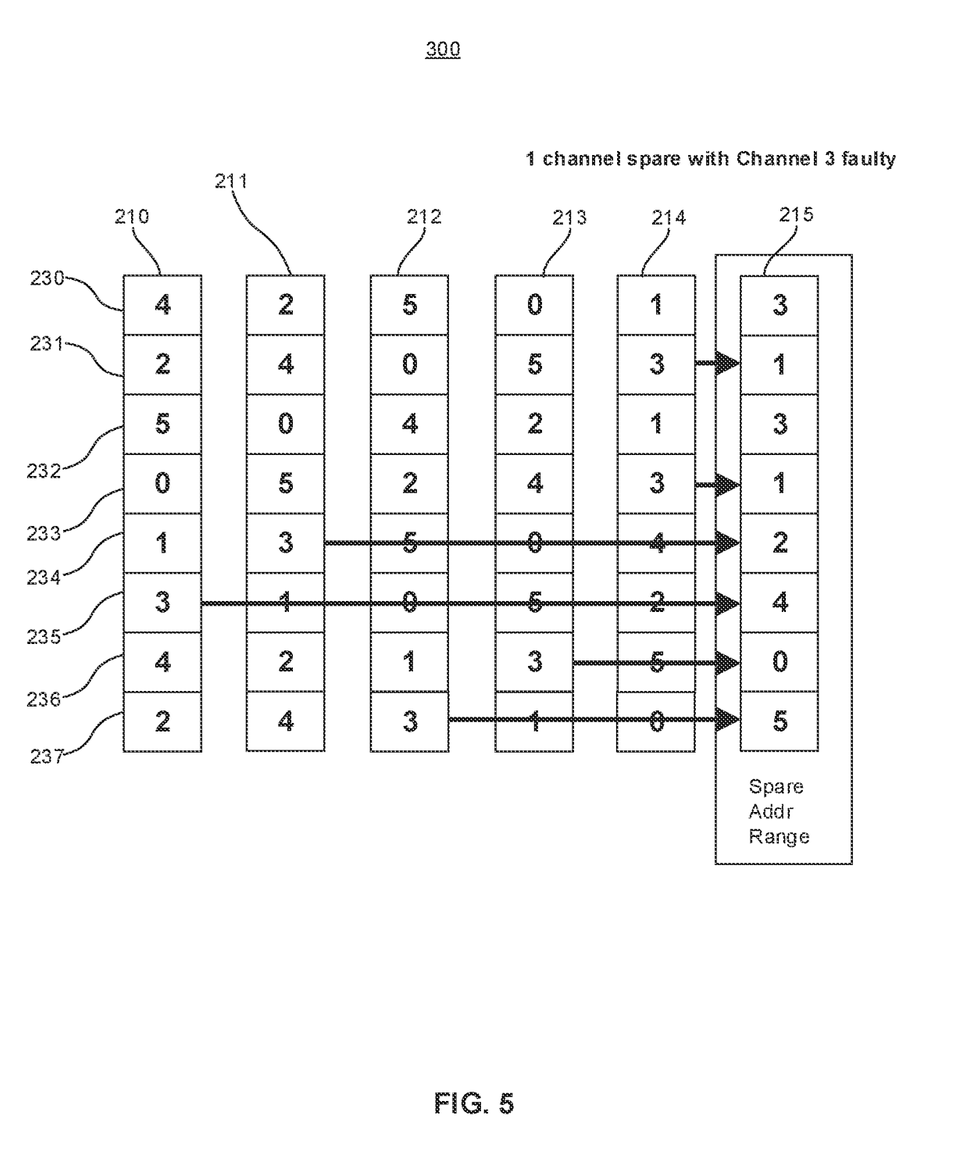
FIG. 5 is a representation of the illustrative mapping array of FIG. 3, with annotations showing an example of remapping in the event of another memory failure.

By way of comparison, FIG. 5 is provided to show remapping in the context of mapping array 300 of FIG. 3 when all or part of memory channel 3 fails. As can be seen from FIG. 5, when all or part of memory channel 3 fails (i.e., when the minimum spareable entity denoted as channel 3 fails), the system memory address originally corresponding to row 231, column 214 is remapped from channel 3/offset 1 to channel 1/offset 1; the system memory address originally corresponding to row 233, column 214 is remapped from channel 3/offset 3 to channel 1/offset 3; the system memory address originally corresponding to row 234, column 211 is remapped from channel 3/offset 4 to channel 2/offset 4; the system memory address originally corresponding to row 235, column 210 is remapped from channel 3/offset 5 to channel 4/offset 5; the system memory address originally corresponding to row 236, column 213 is remapped from channel 3/offset 6 to channel 0/offset 6; and the system memory address originally corresponding to row 237, column 212 is remapped from channel 3/offset 7 to channel 5/offset 7. Regarding rows 230 and 232, since none of the non-spareable physical memory addresses for the rows were originally mapped to channel 3, no remapping is necessary for the rows.

Figure 6A:
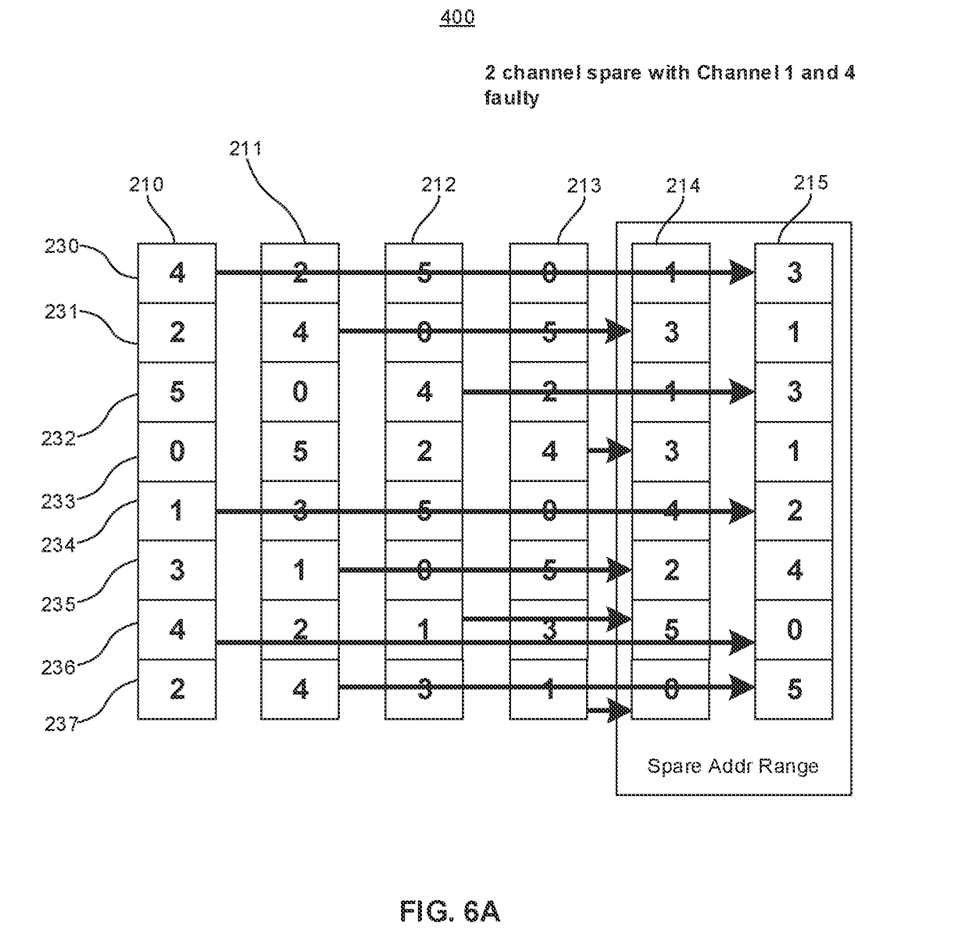
FIG. 6A is a representation of the illustrative mapping array with two columns designated as spares, for use as remapping columns, and with annotations showing an example of remapping in the event of a memory failure.

FIGS. 3-5 concern embodiments in which a single minimum spareable entity unit is designated as spareable. However, the present technology includes embodiments in which multiple minimum spareable entity units are designated as spareable. For instance, two minimum spareable entity units may be designated as spareable, in which case two columns of the corresponding mapping array are designated as spareable columns In such implementation, with the minimum spareable entity being a channel, the two spare physical memory addresses in each row of the mapping array may be in one of the following three states:
(1) Both of the channels to which the two spare physical memory addresses belong have become faulty. In this case, no remapping will be needed for the row.
(2) One of the two channels to which the two spare physical memory addresses belong has become faulty. In this case, one of the system memory addresses in the row will need remapping, and such system memory address will be remapped to the spare channel which is not faulty.
(3) Neither of the channels to which the two spare physical memory addresses belong has become faulty. Then, two of the system memory addresses in the row will need remapping. Remapping may be handled by, for example, remapping to the first spare channel the system memory address originally mapped to the first faulty channel; and remapping to the second spare channel the system memory address originally mapped to the second faulty channel Turning now to FIG. 6A, the figure shows a representation of an illustrative mapping array 400 which is based on the mapping array 200 of FIG. 2 but having columns 214 and 215 designated as spareable columns. FIG. 6A includes annotations showing an example of remapping in the event of a memory failure, and in particular, shows an example of remapping that occurs when channels 1 and 4 are minimum spareable entities that have become unavailable.

As can be seen from FIG. 6A, when channels 1 and 4 fail the system memory address originally corresponding to row 230, column 210 is remapped from channel 4/offset 0 to channel 3/offset 0, with no other mapping for row 230 being necessary because none of the non-spareable physical memory for the row was originally mapped to channel 1. Similarly, the system memory address originally corresponding to row 231, column 211 is remapped from channel 4/offset 1 to channel 3/offset 1; the system memory address originally corresponding to row 232, column 212 is remapped from channel 4/offset 2 to channel 3/offset 2; and the system memory address originally corresponding to row 233, column 213 is remapped from channel 4/offset 3 to channel 3/offset 3. Regarding rows 234 and 235, the system memory address originally corresponding to row 234, column 210 is remapped from channel 1/offset 4 to channel 2/offset 4; and the system memory address originally corresponding to row 235, column 211 is remapped from channel 1/offset 5 to channel 2/offset 5. For each of rows 236 and 237, since neither of the two spare physical memory addresses belongs to channels 1 or 4, two of the system memory addresses in the row are remapped. For row 236, the system memory address originally corresponding to row 236, column 210 is remapped from channel 4/offset 6 to channel 0/offset 6; and the system memory address originally corresponding to row 236, column 212 is remapped from channel 1/offset 6 to channel 5/offset 6. For row 237, the system memory address originally corresponding to row 237 column 211 is remapped from channel 4/offset 7 to channel 5/offset 7; and the system memory address originally corresponding to row 237, column 213 is remapped from channel 1/offset 7 to channel 0/offset 7.

Regarding the spareable columns in FIG. 6A, it should be noted that in many implementations the designated spareable columns will be either the leftmost columns or the rightmost columns of the mapping array so as to maintain an unbroken chain of mapped system memory addresses. For example, for mapping array 400 columns 214 and 215 are designated as spareable columns so that the mapped system memory addresses are contiguous from 00 to 1f.

The remapping illustrated in FIG. 6A adheres to a general algorithm for handling remapping when the minimum spareable entity is a channel and N columns of the mapping array are designated as spareable columns The algorithm is as follows:

Let the faulty channels be F0 . . . FN−1.
For each row
    calculate the channel assignments of all the spare physical memory addresses in the row. Call them C0 . . . CN−1
    eliminate all F0 . . . FN−1 from C0 . . . CN−1, to get spare channel destination(s)
    eliminate all C0 . . . CN−1 from F0 . . . FN−1, to get faulty channel source(s)
    the leftover entries provide the 1:1 mapping, faulty channel source(s) to spare channel destination(s).

By way of example, the general algorithm applies to FIG. 6A rows 230 and 237 as follows:
Row 230
  N is 2, and the faulty channels are {F0, F1}={1, 4}.
  For the row
    the channel assignments of the spare physical memory addresses are {C0, C1}={1, 3}
    eliminating {F0, F1} from {C0, C1}={3}
    eliminating {C0, C1} from {F0, F1}={4}
    the mapping is from channel 4 to channel 3.
Row 237
  N is 2, and the faulty channels are {F0, F1}={1, 4}.
  For the row
    the channel assignments of the spare physical memory addresses are {C0, C1}={0, 5}
    eliminating {F0, F1} from {C0, C1}={0, 5}
    eliminating {C0, C1} from {F0, F1}={1, 4}
    the mappings are from channel 1 to channel 0; and from channel 4 to channel 5.

It should be noted that the remapping depicted in FIG. 6A is a one-pass remapping. That is, in the remapping of FIG. 6A, for each row, each system memory address originally mapped to a channel that later becomes unavailable is directly remapped to a channel in one of the spareable columns. However, the present technology may be implemented using techniques other than one-pass remapping. For example, the technology may be implemented using two-pass remapping. To illustrate, two-pass remapping FIG. 6B is provided.

Figure 6B:
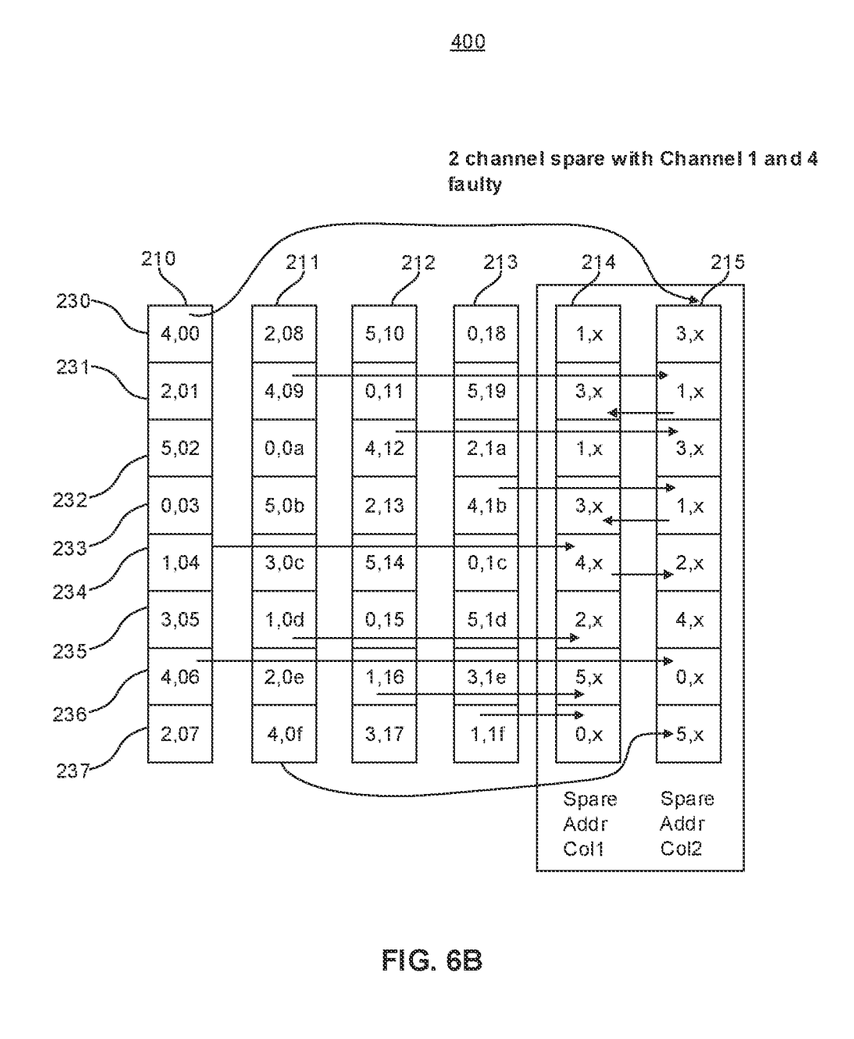
FIG. 6B is a representation of the mapping array of FIG. 6A with annotations showing an example of the remapping as executed according to a two-pass remapping implementation.

FIG. 6B is a representation of the mapping array of FIG. 6A with annotations showing an example of the remapping as executed according to a two-pass remapping implementation. As can be seen from FIG. 6B, each faulty channel is associated with a first-pass spareable column, faulty channel 4 with column 215, and faulty channel 1 with column 214. For each row, for each system memory address mapped to a faulty channel, a first pass is executed for attempting to remap the system memory address to the channel designated by the first-pass spareable column. If the channel designated by the first-pass spareable column is not itself a faulty channel, the remapping is completed for the system memory address by remapping the system memory address to the channel designated by the first-pass spareable column. However, if the channel designated by the first-pass spareable column is itself a faulty channel, a second pass is executed to remap the system memory address to the other spareable column. For example, when channel 4 becomes unavailable, the system memory address "00" is remapped in one pass, from channel 4/offset 0 (row 230, column 210) to channel 3/offset 0 (row 230, column 215).

By contrast, two passes are required to remap the system memory address "09" when channel 4 becomes unavailable. In a first pass, an attempt is made to remap the system memory address "09" from channel 4/offset 1 (row 231, column 211) to channel 1/offset 1 (row 231, column 215), but channel 1 is also faulty so a second pass is necessary. In the second pass, the system memory address "09" is remapped from channel 1/offset 1 (row 231, column 215) to channel 3/offset 1 (row 231, column 214). By way of further example, when channel 1 becomes unavailable a first pass attempt is made to remap the system memory address "04" from channel 1/offset 4 (row 234, column 210) to channel 4/offset 4 (row 234, column 214), but since channel 4 is also faulty a second pass is made to remap system memory address "04" from channel 4/offset 4 (row 234, column 214) to channel 2/offset 4 (row 234, column 215).

Figure 7:
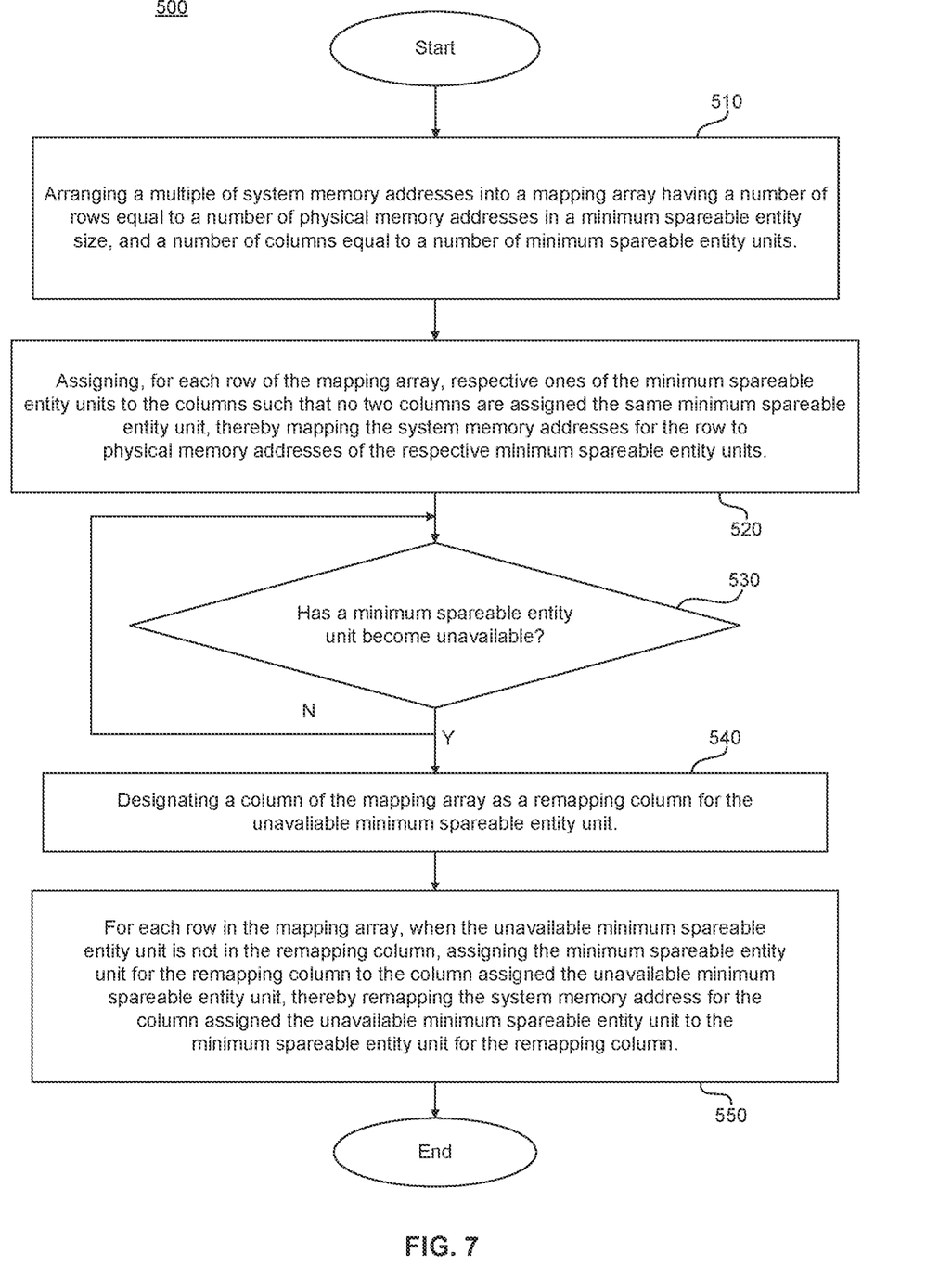
FIG. 7 is a flow chart depicting a method for mapping system memory addresses to physical memory addresses.

FIG. 7 is a flow chart depicting a method 500 for mapping system memory addresses to physical memory addresses. The method includes a first step 510 of arranging a multiple of system memory addresses into a mapping array having a number of rows equal to a number of physical memory addresses in a minimum spareable entity unit, and a number of columns equal to a number of minimum spareable entity units. Notably, the number of minimum spareable entity units may be equal to an integer quotient obtained when a number of physical memory addresses in a memory space is divided by the number of physical memory addresses in the minimum spareable entity unit. In any event, the next step, step 520, is assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units. Then a monitoring operation is conducted, step 530, to determine whether or not a minimum spareable entity unit, e.g., a channel of memory, has become unavailable. If not, the monitoring is continued. But if a minimum spareable entity unit has become unavailable, e.g., due to failure of all or a part of the minimum spareable entity unit, then the method proceeds according to steps 540 and 550. Step 540 is a step of designating a column of the mapping array as a remapping column for the unavailable minimum spareable entity. Step 550 is a step of, for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column.

Embodiments of the present technology include, but are not restricted to, the following.

(1) A method for mapping system memory addresses to physical memory addresses, including arranging a plurality of system memory addresses into a mapping array having a number of rows equal to a number of physical memory addresses in a minimum spareable entity unit, and a number of columns equal to a number of minimum spareable entity units; and assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units, wherein when one of the minimum spareable entity units becomes an unavailable minimum spareable entity unit, designating a column of the mapping array as a remapping column for the unavailable minimum spareable entity unit, and for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column.

(2) The method according to (1), wherein when one of the minimum spareable entity units becomes an unavailable minimum spareable entity unit, the method further includes invalidating mappings of system memory addresses to physical memory addresses indicated by the remapping column prior to the minimum spareable entity unit becoming unavailable.

(3) The method according to (1), wherein the minimum spareable entity units are one of channels, pseudo-channels, memory banks, or memory pages.

(4) The method according to (1), wherein mapping the system memory addresses for the row to respective physical memory addresses of the minimum spareable entity unit includes, for each system memory address, mapping the system memory address to a physical memory address corresponding to the minimum spareable entity unit and an offset.

(5) The method according to (4), wherein the offset corresponds to the position of the row within the mapping array.

(6) The method according to (1), wherein when a plurality of the minimum spareable entity units become unavailable minimum spareable entity units, designating a plurality of columns of the mapping array as respective remapping columns for the unavailable minimum spareable entity units, and for each row in the mapping array, for each unavailable minimum spareable entity unit that is not in the remapping columns, assigning the minimum spareable entity unit for one of the remapping columns to the column assigned the unavailable minimum spareable entity unit, thereby remapping the system memory address for the column assigned the unavailable minimum spareable entity unit to the minimum spareable entity unit for the remapping column.

(7) The method according to (6), wherein when a plurality of the minimum spareable entity units become unavailable minimum spareable entity units, the method further includes invalidating mappings of system memory addresses to physical memory addresses indicated by the remapping columns prior to the minimum spareable entity units becoming unavailable.

(8) The method according to (1), wherein the one of the minimum spareable entity units becomes an unavailable minimum spareable entity unit when there is a physical memory failure.

(9) A processing system including a processor; and a memory, wherein system memory addresses are mapped to physical memory addresses of the memory by arranging a plurality of system memory addresses into a mapping array having a number of rows equal to a number of physical memory addresses in a minimum spareable entity unit, and a number of columns equal to a number of minimum spareable entity units; and assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units, wherein when one of the minimum spareable entity units becomes an unavailable minimum spareable entity unit, designating a column of the mapping array as a remapping column for the unavailable minimum spareable entity unit, and for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column.

(10) The processing system according to (9), wherein the processor is an application-specific integrated circuit (ASIC) and the memory is a high bandwidth (HBW) memory.

(11) The processing system according to (9), wherein the memory is a high bandwidth (HBW) memory.

(12) The processing system according to (9), wherein when one of the minimum spareable entity units becomes an unavailable minimum spareable entity unit, the method further includes invalidating mappings of system memory addresses to physical memory addresses indicated by the remapping column prior to the minimum spareable entity unit becoming unavailable.

(13) The processing system according to (9), wherein the minimum spareable entity units are one of channels, pseudo-channels, memory banks, or memory pages.

(14) The processing system according to (9), wherein mapping the system memory addresses for the row to respective physical memory addresses of the minimum spareable entity unit includes, for each system memory address, mapping the system memory address to a physical memory address corresponding to the minimum spareable entity unit and an offset.

(15) The processing system according to (14), wherein the offset corresponds to the position of the row within the mapping array.

(16) The processing system according to (9), wherein when a plurality of the minimum spareable entity units become unavailable minimum spareable entity units, designating a plurality of columns of the mapping array as respective remapping columns for the unavailable minimum spareable entity units, and for each row in the mapping array, for each unavailable minimum spareable entity unit that is not in the remapping columns, assigning the minimum spareable entity unit for one of the remapping columns to the column assigned the unavailable minimum spareable entity unit, thereby remapping the system memory address for the column assigned the unavailable minimum spareable entity unit to the minimum spareable entity unit for the remapping column.

(17) The processing system according to (16), wherein when a plurality of the minimum spareable entity units become unavailable minimum spareable entity units, the method further includes invalidating mappings of system memory addresses to physical memory addresses indicated by the remapping columns prior to the minimum spareable entity units becoming unavailable.

(18) The processing system according to (9), wherein the one of the minimum spareable entity units becomes an unavailable minimum spareable entity unit when there is a physical memory failure.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims.

The invention claimed is:

1. A method for mapping system memory addresses to physical memory addresses, comprising:
arranging a plurality of system memory addresses into a mapping array having a number of rows equal to a number of physical memory addresses in a minimum spareable entity unit, and a number of columns equal to a number of minimum spareable entity units; and
assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units,
wherein when one of the minimum spareable entity units becomes an unavailable minimum spareable entity unit, designating a column of the mapping array as a remapping column for the unavailable minimum spareable entity unit, and
for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column, and
wherein mapping the system memory addresses for the row to respective physical memory addresses of the minimum spareable entity unit comprises, for each system memory address, mapping the system memory address to a physical memory address corresponding to the minimum spareable entity unit and an offset.

2. The method according to claim 1, wherein when one of the minimum spareable entity units becomes an unavailable minimum spareable entity unit, the method further comprises invalidating mappings of system memory addresses to physical memory addresses indicated by the remapping column prior to the minimum spareable entity unit becoming unavailable.

3. The method according to claim 1, wherein the minimum spareable entity units are one of channels, pseudo-channels, memory banks, or memory pages.

4. The method according to claim 1, wherein the offset corresponds to the position of the row within the mapping array.

5. The method according to claim 1, wherein when a plurality of the minimum spareable entity units become unavailable minimum spareable entity units,
designating a plurality of columns of the mapping array as respective remapping columns for the unavailable minimum spareable entity units, and
for each row in the mapping array, for each unavailable minimum spareable entity unit that is not in the remapping columns, assigning the minimum spareable entity unit for one of the remapping columns to the column assigned the unavailable minimum spareable entity unit, thereby remapping the system memory address for the column assigned the unavailable minimum spareable entity unit to the minimum spareable entity unit for the remapping column.

6. The method according to claim 5, wherein when a plurality of the minimum spareable entity units become unavailable minimum spareable entity units, the method further comprises invalidating mappings of system memory addresses to physical memory addresses indicated by the remapping columns prior to the minimum spareable entity units becoming unavailable.

7. The method according to claim 1, wherein the one of the minimum spareable entity units becomes an unavailable minimum spareable entity unit when there is a physical memory failure.

8. A processing system comprising:
a processor; and
a memory,
wherein system memory addresses are mapped to physical memory addresses of the memory by:
arranging a plurality of system memory addresses into a mapping array having a number of rows equal to a number of physical memory addresses in a minimum spareable entity unit, and a number of columns equal to a number of minimum spareable entity units; and
assigning, for each row of the mapping array, respective ones of the minimum spareable entity units to the columns such that no two columns are assigned the same minimum spareable entity unit, thereby mapping the system memory addresses for the row to physical memory addresses of the respective minimum spareable entity units,
wherein when one of the minimum spareable entity units becomes an unavailable minimum spareable entity unit,
designating a column of the mapping array as a remapping column for the unavailable minimum spareable entity unit, and
for each row in the mapping array, when the unavailable minimum spareable entity unit is not in the remapping column, assigning the minimum spareable entity unit for the remapping column to the column assigned the unavailable minimum spareable entity unit, thereby remapping the system memory address for the column assigned the unavailable minimum spareable entity unit to the minimum spareable entity unit for the remapping column, and
wherein mapping the system memory addresses for the row to respective physical memory addresses of the minimum spareable entity unit comprises, for each system memory address, mapping the system memory address to a physical memory address corresponding to the minimum spareable entity unit and an offset.

9. The processing system according to claim 8, wherein the processor is an application-specific integrated circuit (ASIC), and the memory is a high bandwidth (HBW) memory.

10. The processing system according to claim 8, wherein the memory is a high bandwidth (HBW) memory.

11. The processing system according to claim 8, wherein when one of the minimum spareable entity units becomes an unavailable minimum spareable entity unit, the method further comprises invalidating mappings of system memory addresses to physical memory addresses indicated by the remapping column prior to the minimum spareable entity unit becoming unavailable.

12. The processing system according to claim 8, wherein the minimum spareable entity units are one of channels, pseudo-channels, memory banks, or memory pages.

13. The processing system according to claim 8, wherein the offset corresponds to the position of the row within the mapping array.

14. The processing system according to claim 8, wherein when a plurality of the minimum spareable entity units become unavailable minimum spareable entity units,
designating a plurality of columns of the mapping array as respective remapping columns for the unavailable minimum spareable entity units, and
for each row in the mapping array, for each unavailable minimum spareable entity unit that is not in the remapping columns, assigning the minimum spareable entity unit for one of the remapping columns to the column assigned the unavailable minimum spareable entity unit, thereby remapping the system memory address for the column assigned the unavailable minimum spareable entity unit to the minimum spareable entity unit for the remapping column.

15. The processing system according to claim 14, wherein when a plurality of the minimum spareable entity units become unavailable minimum spareable entity units, the method further comprises invalidating mappings of system memory addresses to physical memory addresses indicated by the remapping columns prior to the minimum spareable entity units becoming unavailable.

16. The processing system according to claim 8, wherein the one of the minimum spareable entity units becomes an unavailable minimum spareable entity unit when there is a physical memory failure.

* * * * *